United States Patent
Yu

(10) Patent No.: US 7,625,513 B2
(45) Date of Patent: Dec. 1, 2009

(54) HOT EMBOSSING LITHOGRAPHY METHOD

(75) Inventor: Tai-Cherng Yu, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 587 days.

(21) Appl. No.: 11/240,199

(22) Filed: Sep. 30, 2005

(65) Prior Publication Data

US 2006/0108711 A1 May 25, 2006

(30) Foreign Application Priority Data

Nov. 19, 2004 (CN) .................. 2004 1 0052383

(51) Int. Cl.
B28B 3/00 (2006.01)
B28B 17/00 (2006.01)
H01L 25/00 (2006.01)
(52) U.S. Cl. .................. 264/319; 264/293; 977/887
(58) Field of Classification Search .................. 264/293, 264/99, 319, 320, 322, 325, 327, 330, 331.11, 264/331.17; 425/407; 977/887
See application file for complete search history.

(56) References Cited

U.S. PATENT DOCUMENTS

| | | | |
|---|---|---|---|
| 3,881,949 A * | 5/1975 | Brock .................. 134/31 |
| 4,606,841 A * | 8/1986 | Basu et al. .................. 510/409 |
| 5,081,772 A * | 1/1992 | Wyman .................. 34/79 |
| 5,690,973 A * | 11/1997 | Kindt-Larsen et al. .. 425/436 R |
| 5,772,905 A * | 6/1998 | Chou .................. 216/44 |
| 6,949,199 B1 * | 9/2005 | Gauzner et al. .................. 216/2 |
| 2004/0192041 A1 * | 9/2004 | Jeong et al. .................. 438/689 |
| 2006/0043626 A1 * | 3/2006 | Wu et al. .................. 264/101 |

OTHER PUBLICATIONS

LMA Research Reports, 1999-2000.*
Jaszewski, R.W., H. Schift, J. Gobrecht, P. Smith, Hot embossing in polymers as a direct way to pattern resist, Microelectronic Engineering, vol. 41/42 (1998) pp. 575-578.*
Ehrley, W., R. Butz, S. Mantl, External infrared reflection absorption spectroscopy of methanol on an epitaxially grown Si(100)2*1 surface, Surface Science, vol. 248, No. 1-2 (May 1991), pp. 193-200.*
Khang, D.-Y., H.H. Lee, Room-temperature imprint lithography by solvent vapor treatment, Applied Physics Letters, vol. 76, No. 7 (2000) pp. 870-872.*

(Continued)

*Primary Examiner*—Matthew J. Daniels
(74) *Attorney, Agent, or Firm*—Steven M. Reiss

(57) ABSTRACT

A hot embossing lithography method includes the steps of: providing a press mold (20) having a press surface, the press surface having a pattern defined therein; providing a substrate (10') having a polymer thin film (30) formed thereon; aligning the press mold with the polymer thin film; introducing a vapor to moisten the press surface for lowering a surface adsorption energy of the press surface; heating the polymer thin film to a temperature above a glass transition temperature of the polymer thin film, thereby softening the polymer thin film; pressing the press mold into the softened polymer thin film to transfer the pattern of the press mold into the polymer thin film; cooling the polymer thin film and the press mold to a temperature near the glass transition temperature of the polymer thin film; and separating the press mold from the polymer thin film.

18 Claims, 3 Drawing Sheets

OTHER PUBLICATIONS

Kim, E., Y. Xia, X.-M. Zhao, G.M. Whitesides, Solvent-Assisted Microcontact Molding: A Convenient Method for Fabricating Three-Dimensional Structures on Surfaces of Polymers, Advanced Materials, vol. 9, No. 8 (1997) pp. 651-654.*

* cited by examiner

HOT EMBOSSING LITHOGRAPHY METHOD

BACKGROUND OF THE INVENTION

1. Field of the Invention

The invention relates generally to lithography methods for fabrication integrated circuits and micro-devices and, more particularly, to nanoimprint lithography methods for forming, e.g., integrated circuits or ultra fine nanostructures on polymer thin films carried on a substrate.

2. Discussion of the Related Art

Nanoimprint lithography methods are newly developed lithography methods for fabrication of nanostructures with high-resolution, high-throughput and low-cost. The methods are based on an excellent replication fidelity obtained with polymers and combines thermo-plastic molding with common pattern transfer methods. Once a solid stamp (press mold) with a nanorelief on a surface thereof is fabricated, the solid stamp can be used for replication of many identical surface patterns. Therefore, the nanoimprint lithography methods can eliminate many limitations imposed upon conventional optical lithography, such as wavelength limitation, backscattering of particles in the resist and/or the substrate, and interferences. The nanoimprint lithography methods have potential application in the fabrication of, for example, micro electronic/mechanical systems, compact disk storage and magnetic storage systems, opto-electrical and optical devices, biological chips and microfluidic devices.

Hot embossing lithography method, which was proposed by Stephen Y. Chou in 1995, is an important nanoimprint lithography method. The hot embossing lithography method is typically based on pressing a mold into a thin film carried on a substrate to form a relief and then removing the compressed area of the thin film to expose the underlying substrate that replicates an obverse of a protruding pattern of the mold.

Referring to FIGS. 1A to 1D, a typical conventional hot embossing lithography method is shown. First, a mold 200 and a polymer thin film 300 formed on a substrate 100' are provided. The mold 200 includes a main body 201, a number of relief features 202 having a desired shape and a number of recesses (not labeled), each recess being defined between a neighboring pair of relief features 202. The polymer thin film 300 can be deposited or coated on the substrate 100' by any appropriate method, for example spin coating. Generally, the polymer thin film 300 includes a thermoplastic polymer, such as polymethyl methacrylate (PMMA). PMMA has a glass transition temperature about 105 degrees Celsius. When PMMA is heated to a temperature above the glass transition temperature thereof, PMMA is softened, has a low viscosity, and can flow.

The mold 200 can be patterned with the relief features 202 and the recesses with a lateral feature size of less than 25 nanometers. Such relief features 202 and recesses can be created, for example, by electron beam lithography, reactive ion etching (RIE) and/or other appropriate methods. In general, the mold is selected to be hard relative to the softened polymer thin film. The mold can be made of, e.g., metals, dielectrics, semiconductors, ceramics or their combination. Second, the mold 200 and the polymer thin film 300 carried on the substrate 100' are placed in a vacuum chamber (not shown), and the mold 200 is aligning with the polymer thin film 300. Third, the mold 200 and the polymer thin film 300 are heated by a heater 400 to a temperature above the glass transition temperature of the polymer thin film 300. The mold 200 is pressed into the softened polymer thin film 300. As a result, the pattern of the relief features of the mold 200 are transferred to the polymer thin film 300, and a pattern conforming to the pattern of the mold 200 is formed on the polymer thin film 300. Fourth, the mold 200 and the polymer thin film 300 are cooled down, and the mold 200 is separated from the polymer thin film 300.

However, (1) the mold 200 is apt to be adhered to the polymer thin film 300 because of a strong adsorption force between the mold 200 and the polymer thin film 300. (2) Due to a difference in thermal conductivity of the materials, the mold 200 tends to cool down faster than the polymer thin film 300. Thus, the relief features 202 are liable to be jammed with the pattern formed on the polymer thin film 300. These phenomena will damage the pattern formed on the polymer thin film and, therefore, reduce a precision of the pattern on the polymer thin film or even destroy the pattern.

Solutions to solve the above problem have been proposed. For example, it is suggested to form a surface treated layer on a press surface of the mold 200 to reduce an adhesive force between the mold 200 and the polymer thin film 300. However, the sizes of the relief features on the press surface of the mold 200 are very small (less than 25 nanometers). Therefore, it is difficult to form an additional thin layer on the press surface, if even possible. Likewise, it is difficult to maintain a precise depth or width of the relief features on the press surface due to the additional thin layer. Furthermore, the surface treated layer is liable to release from the press surface during operation. Therefore, this solution is hard to practice, and the cost is expensive.

Therefore, what is needed is a hot embossing lithography method that is easy to operate, is relatively inexpensive, and has a high precision for pattern transformation.

SUMMARY

In a preferred embodiment, a hot embossing lithography method includes steps of:

providing a press mold having a press surface, the press surface defining a pattern thereon;

providing a substrate having a polymer thin film formed thereon;

aligning the press mold with the polymer thin film;

introducing a vapor to moisten the press surface of the press mold for lowering a surface adsorption energy of the press surface of the press mold;

heating the polymer thin film to a temperature above a glass transition temperature of the polymer thin film, therefore softening the polymer thin film;

pressing the press mold into the softened polymer thin film for transforming the pattern of the press mold into the polymer thin film;

cooling the polymer thin film and the press mold to a temperature near the glass transition temperature of the polymer thin film; and separating the press mold from the polymer thin film.

Preferably, the method is performed in a vacuum chamber.

Preferably, the press mold is hard relative to the polymer thin film.

Preferably, the polymer thin film includes a thermoplastic polymer, such as polymethyl methacrylate (PMMA), polycarbonate, and polystyrene.

Preferably, the vapor includes water vapor or alcohol vapor.

Preferably, the temperature of the polymer thin film in the heating step is 50~100 degrees Celsius above the glass transition temperature of the polymer thin film.

Preferably, in the pressing step, a pressure of approximately 40~100 bars is applied between the press mold and the polymer thin film.

Preferably, the temperature in the cooling step is approximately 10~30 degrees Celsius above or below (or essentially at) the glass transition temperature of the polymer thin film.

Preferably, the polymer thin film is cooled down faster than the press mold.

Preferably, the press mold includes a relief structure having a chamfer formed at one end thereof. The chamfer defines an angle of about 3~5 degrees with respect to a vertical side surface of the relief structure.

Compared with a conventional method, the hot embossing lithography method of any of the described embodiments has the following advantages. Firstly, a surface absorption energy of the press mold is lowered, allowing the press mold to easily separate from the polymer thin film. Secondly, the vapor used in the method is inexpensive. Thirdly, the method ensures precise transformation of the pattern on the press mold to the polymer thin film without damage to the polymer thin film.

Other advantages and novel features will become more apparent from the following detailed description of preferred embodiments when taken in conjunction with the accompanying drawings.

BRIEF DESCRIPTION OF THE DRAWINGS

Many aspects of the present hot embossing lithography method can be better understood with reference to the following drawings. The components in the drawings are not necessarily to scale, the emphasis instead being placed upon clearly illustrating the principles of the present invention. Moreover, in the drawings, like reference numerals designate corresponding parts throughout the several views.

Figure 1A:
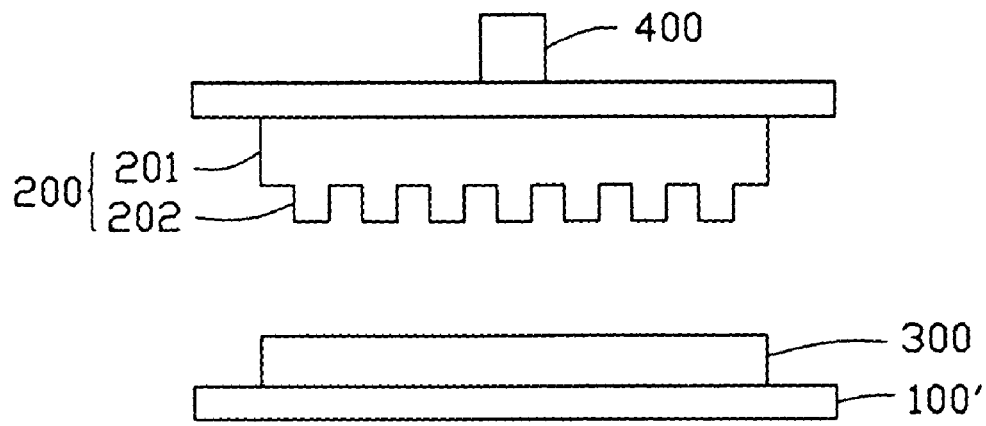
FIG. 1A is a schematic, frontal view of a conventional hot embossing lithography method, showing a mold and a polymer thin film carried on a substrate.
Figure 1B:
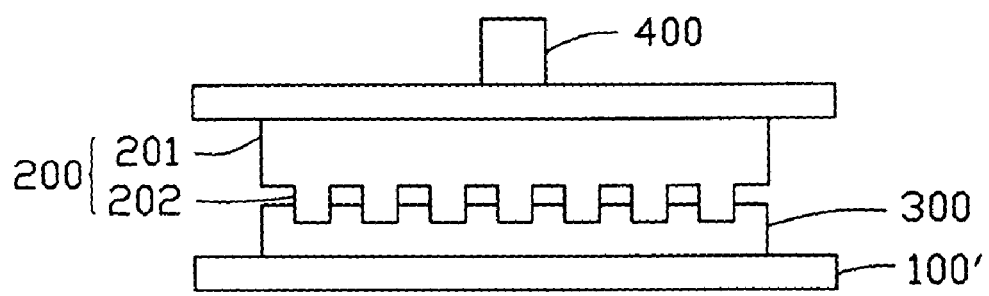
FIG. 1B is similar to FIG. 1A, but showing the mold being aligned with and partly pressed into the polymer thin film.
Figure 1C:
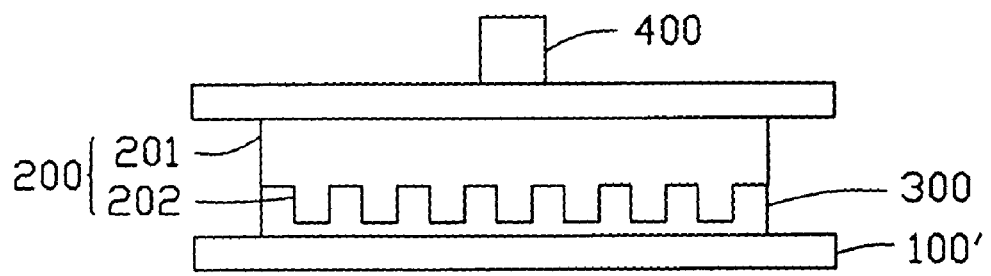
FIG. 1C is similar to FIG. 1B, but showing the mold being fully pressed into the polymer thin film.
Figure 1D:
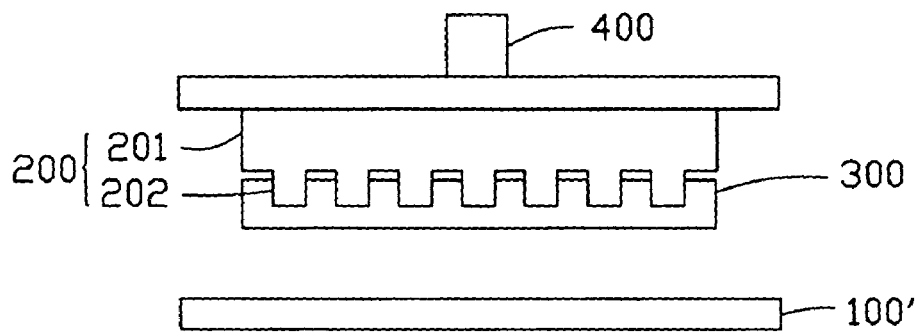
FIG. 1D is similar to FIG. 1C, but showing the mold being adhered to the polymer thin film after cooling down.
Figure 2A:
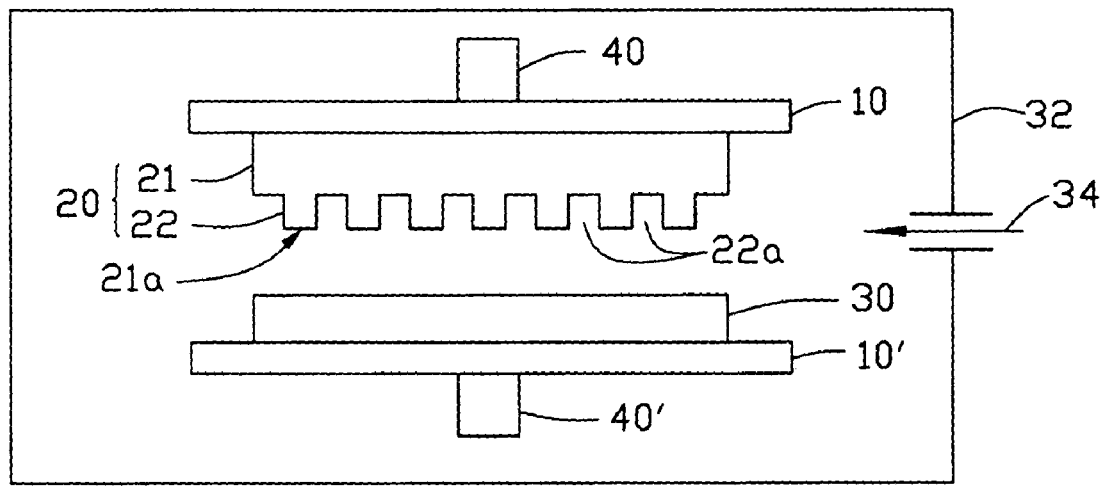
FIG. 2A is a schematic, frontal view of a hot embossing lithography method according to a first preferred embodiment of the present method, showing a mold and a polymer thin film.
Figure 2B:
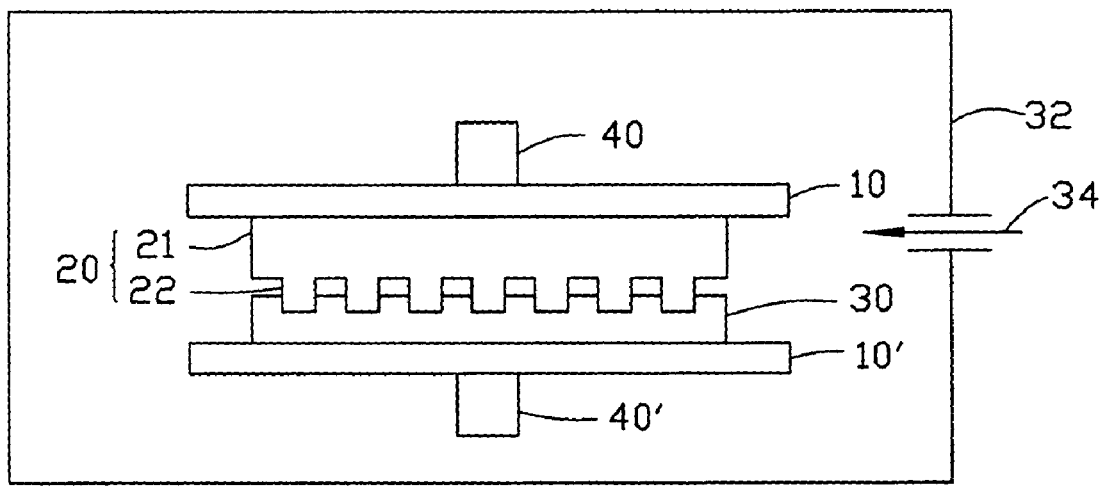
FIG. 2B is similar to FIG. 2A, but showing the mold being aligned with and partly pressed into the polymer thin film.
Figure 2C:
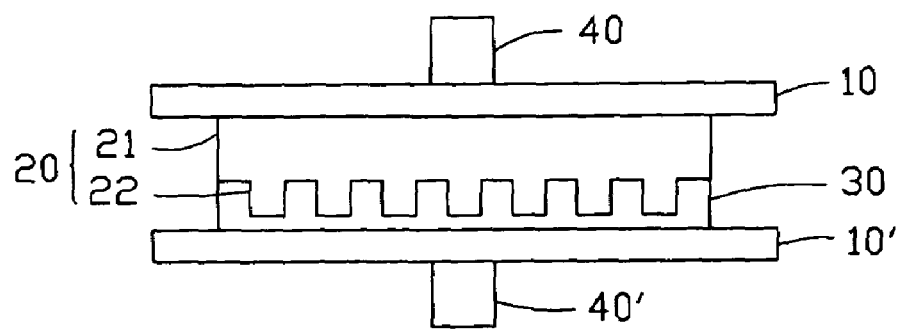
FIG. 2C is similar to FIG. 2B, but showing the mold being fully pressed into the polymer thin film.
Figure 2D:
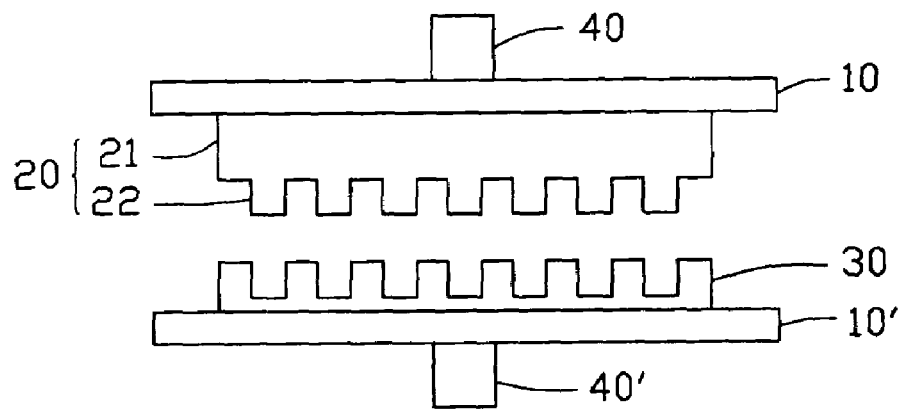
FIG. 2D is similar to FIG. 2C, but showing the mold being separated and released from the polymer thin film.

Corresponding reference characters indicate corresponding parts throughout the several views. The exemplifications set out herein illustrate at least one preferred embodiment of the invention, in one form, and such exemplifications are not to be construed as limiting the scope of the invention in any manner.

DETAILED DESCRIPTION OF PREFERRED EMBODIMENTS

Reference will now be made to the drawings to describe preferred embodiments of the present hot embossing lithography method, in detail.

Referring to FIGS. 2A to 2D, a hot embossing lithography method according to a first preferred embodiment is shown. First, a press mold 20 and a substrate 10' having a polymer thin film 30 formed thereon are provided. The press mold 20 includes a main body 21 and a press surface 21a. The press surface 21a defines a pattern containing a number of relief structures 22 having a desired shape. Every two neighboring relief structures 22 define a recess 22a therebetween. Generally, the relief structures 22 and the recesses 22a each have a lateral size of about 100 nanometers or less, preferably less than 25 nanometers.

The polymer thin film 30 can be deposited or coated on the substrate 10' by any appropriate method, for example, spin coating. Preferably, the polymer thin film 30 includes a thermoplastic polymer, such as polymethyl methacrylate (PMMA), polycarbonate, polystyrene, Shipley 8000 (produced by Shipley), SU8, MR-I8000, and/or MR-I9000 (produced by Micro Resist Technology GmbH). For example, PMMA has glass transition temperature ($T_g$) of about 105 degrees Celsius. When PMMA is heated to a temperature above $T_g$, PMMA is softened, has a low viscosity, and is flowable. Generally, the press mold 20 is selected to be hard relative to the softened polymer thin film 30. Advantageously, the press mold 20 can be made of a material chosen from the group consisting of metals, dielectrics, semiconductors, ceramics, thermoplastics, and composite materials. For example, the press mold 20 can be made, more particularly, of a material selected from group consisting of nickel, silicon, silicon dioxide, silicon nitride, silicon carbide, and fluorinated siloxane copolymer, or of some combination of such materials. Preferably, the mold has a high Knoop hardness, high compression strength, high tensile strength, high thermal conductivity, low thermal expansion coefficient, and good resistance to corrosion.

Second, the press mold 20 and the polymer thin film 30 carried on the substrate 10' are together placed in a vacuum chamber 32 (schematically indicated in FIGS. 2A and 2B only), and the press mold 20 is aligned with the polymer thin film 30.

Third, a vapor 34 (the flow of which is schematically indicated by an arrow in FIGS. 2A and 2B) is introduced into the vacuum chamber 32. Thus, the vapor 34 is dispersed to the press surface 21a of the press mold 20, and the press surface 21a is moistened. Therefore, a surface adsorption energy of the press surface 21a is lowered, thereby facilitating the subsequent separation and removal of the press mold 20 from the polymer thin film 30. Preferably, the vapor 34 has a low molecular weight, such as less than 100. Advantageously, the vapor is selected from water vapor and alcohol vapor (or a combination of such vapors).

Fourth, the press mold 20 and the polymer thin film 30 are heated by heating devices 40 and 40' to a temperature above the glass transition temperature of the polymer thin film 30. Preferably, the press mold 20 and the polymer thin film 30 are heated to a temperature about 50~100 degrees Celsius above the glass transition temperature of the polymer thin film 30. Therefore, the polymer thin film 30 is softened. Then, a pressure is applied between a top plate 10 and the substrate 10', causing the press mold 20 to be pressed into the softened polymer thin film 30. Preferably, the pressure applied between the top plate 10 and the substrate 10' is approximately 40~100 bars. Thus, the pattern of the press mold 20 is transferred to the polymer thin film 30, and a second pattern conforming to the pattern of the press mold 20 is formed on the polymer thin film 30.

Fifth, the press mold 20 and the polymer thin film 30 are cooled down to a temperature near the glass transition temperature of the polymer thin film 30, and the press mold 20 is separated and removed from the polymer thin film 30. Preferably, the press mold 20 and the polymer thin film 30 are cooled down to a temperature about 10~30 degrees Celsius above or below the $T_g$ or essentially at $T_g$ (i.e., a temperature in a range approximately within 10 to 30° C. of $T_g$). Therefore, the pattern on the press mold 20 is successfully transferred to the polymer thin film 30, and the polymer thin film 30 is ready for subsequent process. Due to the lowered surface absorption energy of the press surface of the press mold 20, damage that often occurred in a conventional process are avoided.

Figure 3:
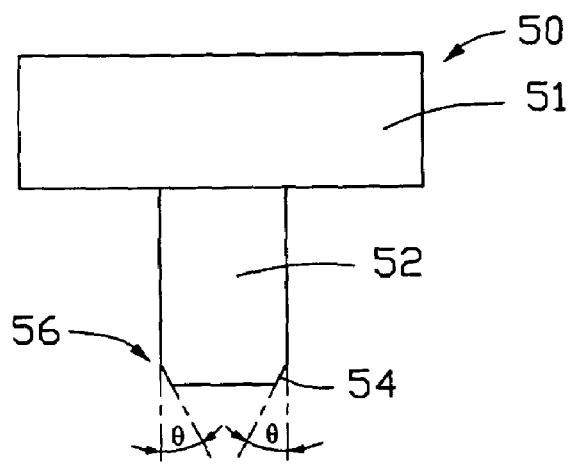
FIG. 3 is a schematic, frontal view of a relief structure of a press mold according to a second preferred embodiment of the present method.

Referring to FIG. 3, a press mold 50 according to a second embodiment of the present method is shown. This embodiment includes substantially same steps with the first embodiment but using a press mold 50 having chamfers 54, as shown in FIG. 3. The press mold 50 employed in the second embodiment is similar to the press mold 20 used in the first embodiment and includes a main body 51 and a number of relief structures 52 (only one is shown in FIG. 3) formed thereon. Each of the relief structures 52 forms two chamfers 54 at one distal end 56 of a given relief structure 52, opposite the main body 52. Each of the chamfers 54 forms an angle about 3~5 degree with respect to a corresponding vertical side surface of the associated relief structure 52. The relief structures 52 with chamfers 54 at one end 56 facilitate separation and removal of the press mold 50 from the polymer thin film without significant changes on the configuration of the press mold 50.

Preferably, in the above described embodiments, the press mold 20 is cooled down slowly, and the polymer thin film 30 is cooled down faster than the press mold 20. In a conventional hot embossing lithography method, the press mold is generally cooled down faster than the polymer thin film due the inherent properties of the materials during the cooling down step. This differential cooling causes the press mold to shrink faster than the polymer thin film. Therefore, the press mold is jammed in the polymer thin film and is hindered from separation and removal from the polymer thin film. This problem can be solved by cooling down the press mold 20 slowly and, simultaneously, cooling down the polymer thin film 30 faster by controlling the heating devices 40 and 40', respectively. Thereby, the pattern formed in the polymer thin film 30 is shrunken faster than the pattern of the press mold 20. As a result, the press mold 20 is easier to separate and remove from the polymer thin film 30.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

I claim:

1. A hot embossing lithography method, comprising the steps of:
   providing a press mold having a nano pattern defined therein;
   providing a polymer thin film;
   aligning the press mold with the polymer thin film;
   heating the polymer thin film to a temperature above a glass transition temperature of the polymer thin film;
   introducing a vapor into contact with the press mold, the vapor thereby lowering a surface adsorption energy of the press mold, wherein the vapor comprises alcohol vapor;
   pressing the press mold into the heated polymer thin film;
   cooling the polymer thin film and the press mold, wherein the polymer thin film is cooled down faster than the press mold; and
   separating the press mold from the polymer thin film, comprising the alcohol vapor facilitating such separation.

2. The hot embossing lithography method as claimed in claim 1, wherein the press mold is hard relative to the polymer thin film.

3. The hot embossing lithography method as claimed in claim 1, wherein the polymer thin film comprises a thermoplastic polymer.

4. The hot embossing lithography method as claimed in claim 3, wherein the polymer thin film is made of a material selected from polymethyl methacrylate (PMMA), polycarbonate, and polystyrene.

5. The hot embossing lithography method as claimed in claim 1, wherein the method is performed in a vacuum chamber.

6. The hot embossing lithography method as claimed in claim 1, wherein the press mold is made of a material selected from the group consisting of metals, dielectrics, semiconductors, thermoplastics, ceramics, and composites.

7. The hot embossing lithography method as claimed in claim 6, wherein the press mold is comprised of at least material chosen from the group consisting of nickel, silicon, silicon dioxide, silicon nitride, silicon carbide, and fluorinated siloxane copolymer.

8. A hot embossing lithography method, comprising the steps of:
   providing a press mold having a press surface, the press surface having a pattern defined therein;
   providing a substrate having a polymer thin film formed thereon;
   aligning the press mold with the polymer thin film;
   introducing a vapor to moisten the press surface of the press mold, the vapor thereby lowering a surface adsorption energy of the press surface of the press mold, wherein the vapor comprises alcohol vapor;
   heating the polymer thin film to a temperature about 50~100 degrees Celsius above a glass transition temperature of the polymer thin film, thereby softening the polymer thin film;
   pressing the press mold into the softened polymer thin film to transfer the pattern of the press mold into the polymer thin film;
   cooling the polymer thin film and the press mold to a temperature in a range within approximately 10~30 degrees Celsius of the glass transition temperature of the polymer thin film; and
   separating the press mold from the polymer thin film, comprising the alcohol vapor facilitating such separation.

9. The hot embossing lithography method as claimed in claim 8, wherein the press mold is hard relative to the polymer thin film.

10. The hot embossing lithography method as claimed in claim 8, wherein the polymer thin film comprises a thermoplastic polymer.

11. The hot embossing lithography method as claimed in claim 10, wherein the polymer thin film is made of a material selected from polymethyl methacrylate (PMMA), polycarbonate, and polystyrene.

12. The hot embossing lithography method as claimed in claim 8, wherein the method is performed in a vacuum chamber.

13. The hot embossing lithography method as claimed in claim 8, wherein a pressure between the press mold and the polymer thin film in the pressing step is approximately 40~100 bars.

14. The hot embossing lithography method as claimed in claim 8, wherein the polymer thin film is cooled down faster than the press mold.

15. The hot embossing lithography method as claimed in claim 8, wherein the press mold is made of a material selected from group consisting of metals, dielectrics, semiconductors, thermoplastics, ceramics, and composites.

16. The hot embossing lithography method as claimed in claim 15, wherein the press mold is comprised of at least material chosen from the group consisting of nickel, silicon, silicon dioxide, silicon nitride, silicon carbide, and fluorinated siloxane copolymer.

17. A hot embossing lithography method, comprising the steps of:

providing a press mold having a press surface, the press surface having a pattern defined therein;

providing a substrate having a polymer thin film formed thereon;

aligning the press mold with the polymer thin film;

introducing a vapor to moisten the press surface of the press mold, the vapor thereby lowering a surface adsorption energy of the press surface of the press mold;

heating the polymer thin film to a temperature about 50~100 degrees Celsius above a glass transition temperature of the polymer thin film, thereby softening the polymer thin film;

pressing the press mold into the softened polymer thin film to transfer the pattern of the press mold into the polymer thin film, wherein a pressure between the press mold and the polymer thin film is approximately 40~100 bars;

cooling the polymer thin film and the press mold to a temperature in a range within approximately 10~30 degrees Celsius of the glass transition temperature of the polymer thin film; and separating the press mold from the polymer thin film, comprising the alcohol vapor facilitating such separation.

18. The hot embossing lithography method as claimed in claim 17, wherein the polymer thin film is cooled down faster than the press mold.

* * * * *

UNITED STATES PATENT AND TRADEMARK OFFICE
CERTIFICATE OF CORRECTION

PATENT NO. : 7,625,513 B2  Page 1 of 1
APPLICATION NO. : 11/240199
DATED : December 1, 2009
INVENTOR(S) : Tai-Cherng Yu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1014 days.

Signed and Sealed this

Second Day of November, 2010

David J. Kappos
*Director of the United States Patent and Trademark Office*